(12) United States Patent
Jeun et al.

(10) Patent No.: US 9,437,818 B2
(45) Date of Patent: Sep. 6, 2016

(54) EXPOSURE APPARATUS, METHOD OF CONTROLLING THE SAME, AND ALIGNMENT METHOD FOR EXPOSURE

(71) Applicant: Samsung Display Co., Ltd., Yongin, Gyeonggi-Do (KR)

(72) Inventors: Jin-Hong Jeun, Yongin (KR); Seok-Joo Lee, Yongin (KR); Jung-Hun Yeon, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 419 days.

(21) Appl. No.: 13/907,792

(22) Filed: May 31, 2013

(65) Prior Publication Data

US 2014/0168624 A1 Jun. 19, 2014

(30) Foreign Application Priority Data

Dec. 14, 2012 (KR) .......................... 10-2012-0146637

(51) Int. Cl.
*G03F 7/20* (2006.01)
*H01L 51/00* (2006.01)
*G03F 9/00* (2006.01)

(52) U.S. Cl.
CPC ......... *H01L 51/0013* (2013.01); *G03F 9/7019* (2013.01)

(58) Field of Classification Search
CPC .. G03F 9/7007; G03F 9/7019; G03F 9/7065; G03F 7/7055; G03F 7/70775
See application file for complete search history.

(56) References Cited

U.S. PATENT DOCUMENTS

| 4,629,313 A * | 12/1986 | Tanimoto ......................... 355/53 |
| 8,187,778 B2 | 5/2012 | Choi et al. |
| 2010/0099049 A1* | 4/2010 | Owa ................... G03F 7/70291 430/322 |
| 2011/0033790 A1* | 2/2011 | Mishima ................ G03B 27/42 430/30 |
| 2012/0019793 A1* | 1/2012 | Park .................... G03F 7/70275 355/53 |

FOREIGN PATENT DOCUMENTS

| KR | 10-2008-0114423 A | 12/2008 |
| KR | 10-2010-0034615 A | 4/2010 |
| KR | 10-2010-0094143 A | 8/2010 |

* cited by examiner

*Primary Examiner* — Steven H Whitesell Gordon
(74) *Attorney, Agent, or Firm* — Knobbe Martens Olson & Bear LLP

(57) ABSTRACT

An exposure apparatus capable of preventing a reduction in its accuracy due to, for example, the influence of aging or the influence of heat is disclosed. Also disclosed is a method of controlling the same, and an alignment method for exposure. In one aspect, the exposure apparatus includes a main stage for adjusting a position of a substrate, a beam irradiation unit for irradiating a beam onto a mask, and a beam monitoring unit having a position fixed with respect to the main stage, and for recognizing the beam emitted from the beam irradiation unit and passed through one pattern of the mask.

15 Claims, 7 Drawing Sheets

EXPOSURE APPARATUS, METHOD OF CONTROLLING THE SAME, AND ALIGNMENT METHOD FOR EXPOSURE

CROSS-REFERENCE TO RELATED APPLICATIONS

This application claims the benefit of Korean Patent Application No. 10-2012-0146637, filed on Dec. 14, 2012, in the Korean Intellectual Property Office, the disclosure of which is incorporated herein in its entirety by reference.

BACKGROUND

1. Field

The disclosed technology relates to an exposure apparatus for thin film deposition, a method of controlling the same, and an alignment method for exposure, and more particularly, to the use of a feedback loop to more precisely control the position of components of the apparatus undergoing movement and thereby accurately calibrate the patterning of a thin film.

2. Description of the Related Technology

In a general thin film exposure apparatus, light emitted from a light source is irradiated onto a mask, is passed through an opening patterned in the mask, and then is incident on a substrate. As such, light is irradiated onto a preset region of the substrate in a corresponding shape of the opening patterned in the mask.

In the above-described exposure process, in order to accurately expose the preset region of the substrate in a corresponding shape of the opening patterned in the mask, alignment of the mask or the substrate is a significant concern.

For example, a typical process is a laser-induced thermal imaging (LITI) process in which a laser beam emitted from a light source is passed through and is shaped by using a mask. The shaped laser beam reaches a donor film so as to transfer a certain amount of the organic or inorganic material as a thin film layer onto a substrate. Before the LITI process is initiated, the laser beam should be accurately aligned to be incident at a preset position (e.g., a certain sub-pixel region) of a substrate on which, for example, a thin film transistor (TFT) is formed This is because a defective electronic product will be produced if the laser beam has an unintended shape or is irradiated onto an unintended region of the substrate.

Accordingly, since alignment of a mask and the position of a region for thin film deposition, a TFT, for example, related to the shape of a laser beam are set in advance, alignment of a substrate on which a region onto which the laser beam is irradiated is critical.

However, in conventional thin film exposure systems, when exposure is repeatedly performed, the accuracy of exposure of the exposure apparatus is reduced due to the influence of aging or the influence of heat, for example. That is, since the driving unit ages due to variations in ambient environmental conditions over time and variations in position of a light source (typically a laser beam) due to heat generated from the exposure process, position errors in exposure patterns are induced.

SUMMARY OF CERTAIN INVENTIVE ASPECTS

The disclosed technology provides an exposure apparatus capable of preventing a reduction in the accuracy of exposure of the exposure apparatus due to, for example, the influence of aging or the influence of heat, a method of controlling the same, and an alignment method for exposure. However, the disclosed technology is not limited thereto.

According to an aspect of the present invention, there is provided an exposure apparatus, comprising: a main stage configured to adjust the position of a substrate; a beam irradiation unit configured to irradiate a beam of light onto a mask; and a beam monitoring unit having a position fixed with respect to the main stage, and configured to recognize the beam emitted from the beam irradiation unit and passed through openings in the mask so as to form a particular pattern.

The exposure apparatus further comprising a control unit configured to output a substrate position adjustment signal indicative of the position of the main stage so as to adjust the position of the substrate.

The control unit may output the substrate position adjustment signal based on information about the beam obtained by the beam monitoring unit. In more detail, the control unit is configured to check a monitored position of the beam incident on the beam monitoring unit, wherein the monitored position is based on the information about the beam obtained by the beam monitoring unit, and wherein the control unit outputs the substrate position adjustment signal based on the difference between the monitored position and a preset reference position.

The substrate position adjustment signal output from the control unit comprises: a first position adjustment signal used to permit an alignment key of the substrate to be disposed at a preset alignment position with respect to the beam irradiation unit; and a second position adjustment signal corresponding to an adjustment vector having the preset reference position as a start point and having the monitored position as an end point.

Alternatively, the exposure apparatus further comprising an alignment key monitoring unit configured to obtain information about the position of an alignment key of the substrate, and the substrate position adjustment signal output from the control unit corresponds to a sum of a base vector having a detected position of the alignment key of the substrate, which is obtained by the alignment key monitoring unit, as a start point and having the preset alignment position with respect to the beam irradiation unit as an end point, and an adjustment vector having the preset reference position as a start point and having the monitored position as an end point.

The exposure apparatus further comprising a mask stage for adjusting the position of the mask, and the control unit outputs a mask position adjustment signal indicative of the position of the mask stage so as to adjust the position of the mask based on information about the beam obtained by the beam monitoring unit. In this case, the control unit is configured to check a monitored position of the beam incident on the beam monitoring unit based on the information about the beam obtained by the beam monitoring unit, and wherein the control unit outputs the mask position adjustment signal based on a difference between the monitored position and a preset reference position.

The exposure apparatus further comprising an alignment key monitoring unit configured to obtain information about the position of an alignment key of the substrate, and the control unit may output an alignment key monitoring unit position adjustment signal configured to adjust the position of the alignment key monitoring unit. In this case, the control unit outputs the alignment key monitoring unit position adjustment signal based on information about the beam obtained by the beam monitoring unit Furthermore, the control unit is configured to check a monitored position of the beam incident on the beam monitoring unit based on the information about the beam obtained by the beam monitoring unit, and wherein the control unit outputs the alignment key monitoring unit position adjustment signal based on the difference between the monitored position and a preset reference position. In more detail, the alignment key monitoring unit position adjustment signal output from the control unit corresponds to an adjustment vector having the preset reference position as a start point and having the monitored position as an end point.

According to another aspect of the disclosed technology, there is provided a method of controlling an exposure apparatus, the method comprising: obtaining information about a beam of light emitted from a beam irradiation unit and passed through openings in a mask so as to form a particular pattern, by a beam monitoring unit having a position fixed with respect to a main stage; checking a monitored position of the beam incident on the beam monitoring unit based on the information about the beam obtained by the beam monitoring unit, and checking the difference between the monitored position and a preset reference position; mounting a substrate on either of the main stage or a substrate mounting unit having a position that is adjustable by the main stage; and adjusting the position of the substrate by outputting a substrate position adjustment signal to the main stage based on the difference between the monitored position and the preset reference position.

The adjusting of the position of the substrate comprises: allowing an alignment key of the substrate to be disposed at a preset alignment position with respect to the beam irradiation unit; and additionally adjusting the position of the substrate by an adjustment vector having the preset reference position as a start point and having the monitored position as an end point.

The adjusting of the position of the substrate comprises adjusting the position of the substrate based on an ultimate vector corresponding to the sum of a base vector having a detected position of the alignment key of the substrate, which is obtained by an alignment key monitoring unit for obtaining information about the position of the alignment key of the substrate, as a start point and having the preset alignment position with respect to the beam irradiation unit as an end point, and an adjustment vector having the preset reference position as a start point and having the monitored position as an end point.

According to another aspect of the disclosed technology, there is provided a method of controlling an exposure apparatus, the method comprising: obtaining information about a beam of light emitted from a beam irradiation unit and passed through openings in a mask so as to form a particular pattern and having a position adjustable by a mask stage, in a beam monitoring unit having a position fixed with respect to a main stage; checking a monitored position of the beam incident on the beam monitoring unit based on the information about the beam obtained by the beam monitoring unit, and checking the difference between the monitored position and a preset reference position; and adjusting the position of the mask by outputting a mask position adjustment signal to the mask stage based on the difference between the monitored position and the preset reference position.

According to another aspect of the disclosed technology, there is provided a method of controlling an exposure apparatus, the method comprising: obtaining information about a beam of light emitted from a beam irradiation unit and passed through openings in a mask so as to form a particular pattern, in a beam monitoring unit having a position fixed with respect to a main stage; checking a monitored position of the beam incident on the beam monitoring unit based on the information about the beam obtained by the beam monitoring unit, and checking the difference between the monitored position and a preset reference position; and adjusting the position of an alignment key monitoring unit for obtaining information about a position of an alignment key of the substrate, based on the difference between the monitored position and the preset reference position.

The adjusting of the position of the alignment key monitoring unit corresponds to an adjustment vector having the preset reference position as a start point and having the monitored position as an end point.

According to another aspect of the disclosed technology, there is provided an alignment method for exposure, the alignment method comprising: checking a monitored position of a beam of light emitted from a beam irradiation unit and passed through openings in a mask so as to form a particular pattern and checking the difference between the monitored position and a preset reference position; providing a substrate; and adjusting the position of the substrate based on the difference between the monitored position and the preset reference position.

The adjusting of the position of the substrate comprises: allowing an alignment key of the substrate to be disposed at a preset alignment position with respect to the beam irradiation unit; and additionally adjusting the position of the substrate by an adjustment vector having the preset reference position as a start point and having the monitored position as an end point.

The adjusting of the position of the substrate may include adjusting the position of the substrate based on an ultimate vector corresponding to the sum of a base vector having a detected position of the alignment key of the substrate as a start point and having the preset alignment position with respect to the beam irradiation unit as an end point, and an adjustment vector having the preset reference position as a start point and having the monitored position as an end point.

According to another aspect of the disclosed technology, there is provided an alignment method for exposure, the alignment method comprising: checking a monitored position of a beam of light emitted from a beam irradiation unit and passed through openings in a mask so as to form a particular pattern and checking the difference between the monitored position and a preset reference position; and adjusting the position of the mask based on the difference between the monitored position and the preset reference position.

According to another aspect of the disclosed technology, there is provided an alignment method for exposure, the alignment method comprising: checking a monitored position of a beam of light emitted from a beam irradiation unit and passed through openings in a mask so as to form a particular pattern and checking a difference between the monitored position and a preset reference position; and adjusting the position of an alignment key monitoring unit for obtaining information about a position of an alignment key of the substrate, based on the difference between the monitored position and the preset reference position.

The adjusting of the position of the alignment key monitoring unit corresponds to an adjustment vector having the preset reference position as a start point and having the monitored position as an end point.

BRIEF DESCRIPTION OF THE DRAWINGS

The above and other features and advantages of the disclosed technology will become more apparent by describing in detail exemplary embodiments thereof with reference to the attached drawings in which.

DETAILED DESCRIPTION OF CERTAIN INVENTIVE EMBODIMENTS

Figure 1:
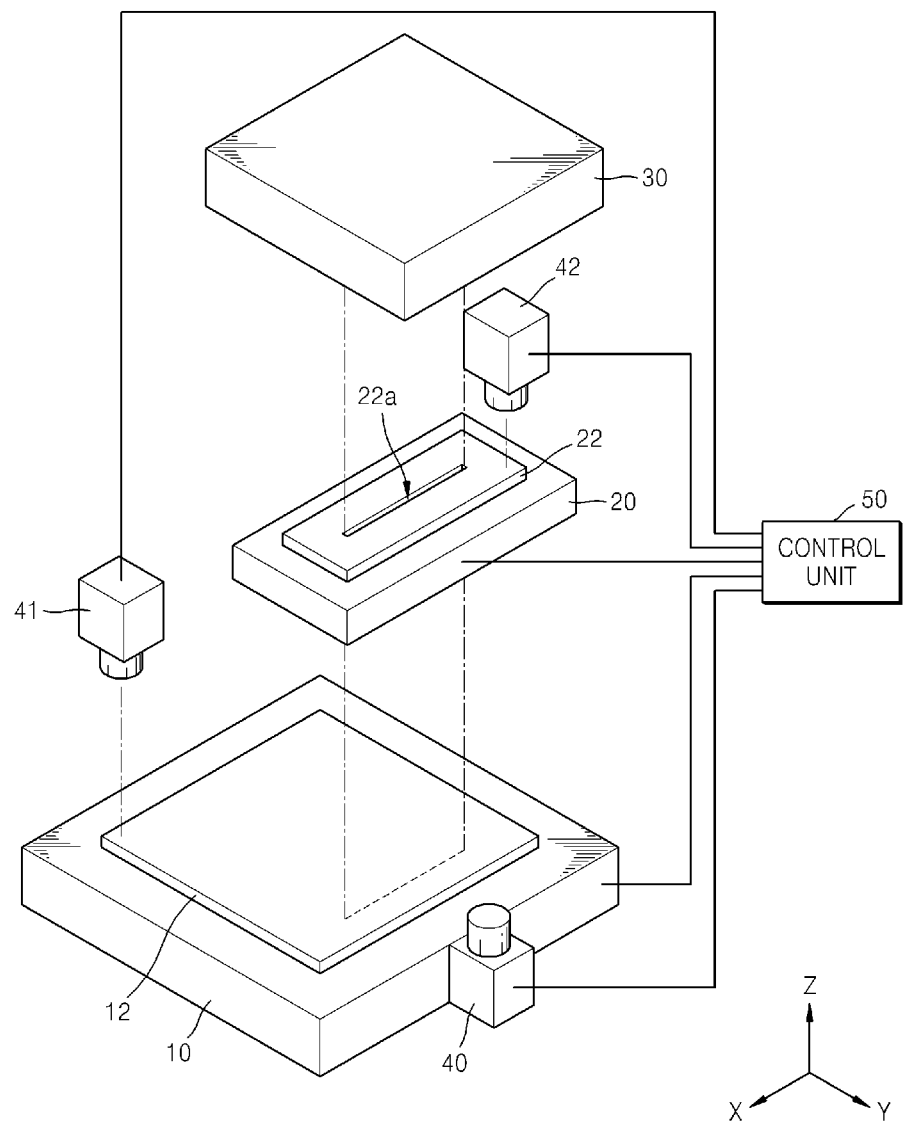
FIG. 1 is a conceptual perspective view of an exposure apparatus according to an embodiment of the disclosed technology.

The disclosed technology will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. The sizes of elements may be exaggerated in the drawings for convenience of explanation.

In the following description, x, y, and z axes are not limited to three axes on an orthogonal coordinate system, and may be interpreted in a broader sense including them. For example, the x, y, and z axes may be orthogonal or non-orthogonal to each other.

Also, sizes and thicknesses of elements in the drawings are arbitrarily provided for convenience of explanation and thus do not restrict the scope of the disclosed technology.

In the drawings, the thicknesses of layers and regions are exaggerated for clarity. It will be understood that when an element, such as a layer, a region, or a substrate, is referred to as being "on" another element, it may be "directly on" the other element or intervening elements may be present.

As used herein, the term "and/or" includes any and all combinations of one or more of the associated listed items.

FIG. 1 is a conceptual perspective view of a thin film exposure apparatus according to an embodiment of the disclosed technology.

The exposure apparatus according to the various embodiments includes a main stage 10, a beam irradiation unit (BIU) 30, and a beam monitoring unit (BMU) 40. As illustrated in FIG. 1, a mask stage 20, an alignment key monitoring unit (AKMU) 41, and an alignment mark monitoring unit (AMMU) 42 are further included.

The main stage 10 adjusts the position of a substrate 12. For example, the main stage 10 adjusts the position of the substrate 12 mounted on the main stage 10, or mounted or mountable on a mounting unit (not shown) connected or connectable to the main stage 10. Furthermore, as illustrated in FIG. 1, while the substrate 12 is mounted on the main stage 10, the position of the substrate 12 can be adjusted, for example, on an x-y plane under the control of a control unit 50. For example, the control unit 50 outputs a substrate position adjustment signal, and the main stage 10 adjusts the position of the substrate 12 according to the substrate position adjustment signal.

Alternatively, various other configurations are possible. For example, the substrate 12 may be disposed on a plurality of substrate pins extending vertically (+z and −z directions) and the main stage 10 may adjust positions of the substrate pins to thereby adjust the position of the substrate 12 placed on the substrate pins. After that, the substrate pins move vertically to allow the substrate 12 to be mounted on the mounting unit.

The main stage 10 can adjust the position of the substrate 12 while the alignment key monitoring unit 41 checks the position of an alignment key on the substrate 12. That is, the position of the alignment key of the substrate 12 is checked via image information obtained by an imaging device (e.g., camera) that is included in the alignment key monitoring unit 41, and the main stage 10 adjusts the position of the substrate 12 in such a way that the alignment key is placed at a preset position.

The mask stage 20 adjusts the position of a mask 22. For example, the mask stage 20 can adjust the position of the mask 22 mounted on the mask stage 20, or mounted or mountable on a mounting unit (not shown) connected or connectable to the mask stage 20. Furthermore, as illustrated in FIG. 1, while the mask 22 is mounted on the mask stage 20, the position of the mask 22 is adjusted, for example, on an x-y plane under the control of the control unit 50. By way of example, the control unit 50 may output a mask position adjustment signal, and the mask stage 20 may adjust the position of the mask 22 according to the mask position adjustment signal.

Alternatively, various other configurations are possible. For example, the mask 22 can be disposed on a plurality of mask pins extending vertically (+z and −z directions), and the mask stage 20 adjusts positions of the mask pins to thereby adjust the position of the mask 22 placed on the mask pins. After that, the mask pins move vertically to allow the mask 22 to be mounted on the mounting unit. In this case, all or some of the substrate pins can be used as the mask pins, and the main stage 10 can be used as the mask stage 20.

The mask stage 20 adjusts the position of the mask 22 while the alignment mark monitoring unit 42 checks a position of an alignment mask on the mask 22. That is, the position of the alignment mask of the mask 22 is checked through image information obtained by an imaging device of the alignment mark monitoring unit 42, and the mask stage 20 adjusts the position of the mask 22 in such a way that the alignment mask is placed at a preset position.

In contrast to the above description, an exposure apparatus according to certain other embodiments of the disclosed technology will not include the mask stage 20, and the mask 22 will be maintained at a certain and fixed position.

The beam irradiation unit 30 irradiates a beam onto the mask 22. The beam emitted from the beam irradiation unit 30 passes through openings in the mask 22 to reach the substrate 12 or to a component placed between the mask 22 and the substrate 12 to thereby produce an intended pattern. For example, a donor material component may deposit a thin film pattern on the substrate associated with a predetermined set of thin film transistors (TFTs). The beam irradiation unit 30 irradiates electromagnetic energy, for example, that characterized by a laser beam. The beam of electromagnetic energy will for convenience be referred to as light, but may encompass higher frequencies than the typical thermal (infrared) light energy associated with exposure systems.

The beam monitoring unit 40 will generally have a position fixed with respect to the main stage 10. For example, as illustrated in FIG. 1, the beam monitoring unit 40 is coupled to a side of the main stage 10 or fixed on a frame connected to the main stage 10. The beam monitoring unit 40 recognizes a beam emitted from the beam irradiation unit 30 and passed through one pattern 22a of the mask 22.

In conventional exposure systems, although a substrate or a mask is accurately placed at a preset position, the accuracy of exposure may be reduced due to the passage of time that elapses over one or more exposures or the effect of heat generated during the exposure, for example. Since even a small change in alignment of an optical unit in a beam irradiation unit or transformation of a frame due to heat generated during exposure, even though the substrate and/or the mask are accurately positioned, the exposure pattern may not be accurately produced at the intended location.

However, the exposure apparatus according to various embodiments can substantially prevent a reduction in the accuracy of exposure of the exposure apparatus due to, for example, the effects of aging or heat. That is, a change such as even a small change in alignment of an optical unit, e.g., lenses, of the beam irradiation unit 30 or transformation of a frame of the exposure apparatus occurs due to heat generated during exposure is undesirable. Since the beam monitoring unit 40 recognizes the beam emitted from the beam irradiation unit 30 and passed through the pattern 22a of the mask 22, the position of the main stage 10 is adjusted accordingly based on information about the recognized beam. Thus, with various embodiments, an exposure can be accurately performed at an intended location of the substrate 12 or a component placed between the mask 22 and the substrate 12.

Figure 2:
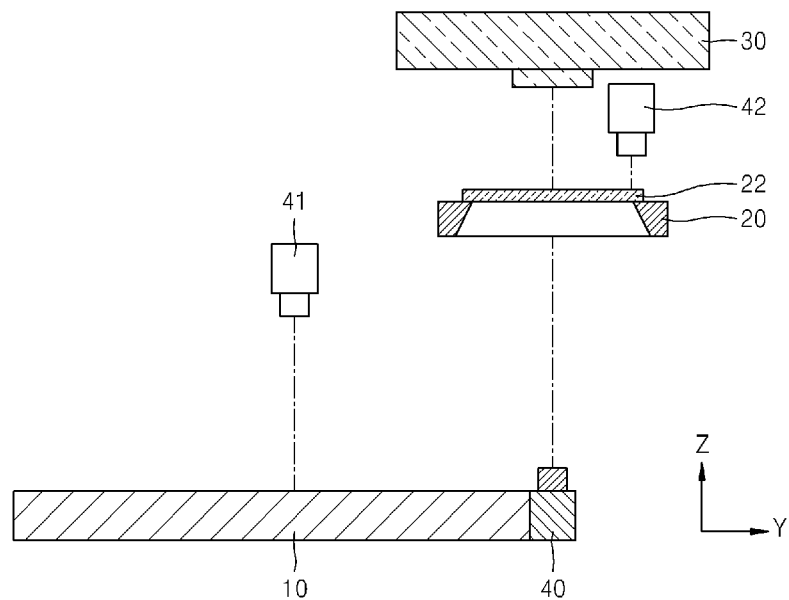
FIG. 2 is a cross-sectional view of the exposure apparatus illustrated in FIG. 1, for describing operation of the exposure apparatus.

FIG. 2 is a cross-sectional view of the exposure apparatus illustrated in FIG. 1, for describing operation of the exposure apparatus. As illustrated in FIG. 2, while the mask 22 is mounted and fixed on the mask stage 20, and prior to the substrate 12 being provided on the main stage 10, the beam monitoring unit 40 is used to calibrate the system. It recognizes, the preset position of a beam emitted from the beam irradiation unit 30 and passed through the pattern 22a of the mask 22. For this, the main stage 10 on which the beam monitoring unit 40 is mounted moves to the position illustrated in FIG. 2 so as to allow the beam monitoring unit 40 to recognize the beam position.

Here, the pattern 22a of the mask 22 may be one of various patterns formed in the mask 22. For example, the "pattern" may be one through which a beam to be exposed on the substrate 12 in an exposure process is passed or it may be a dummy pattern not used in the exposure process but used only in the alignment process used for calibration prior to the exposure process.

Figure 3:
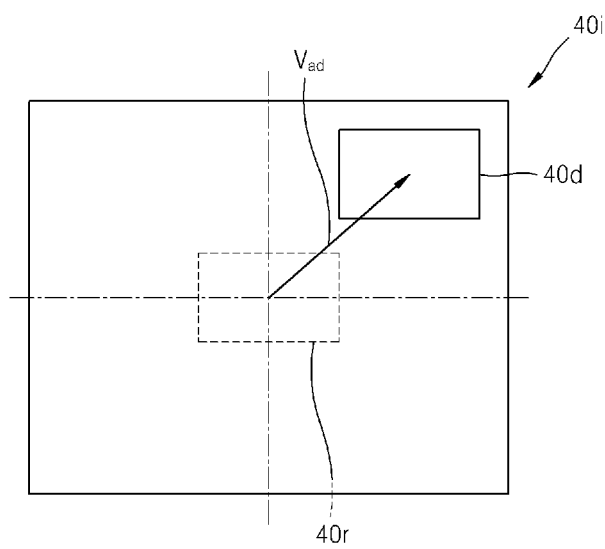
FIG. 3 is a conceptual view of an image of information obtained by recognizing a beam passed through one pattern of a mask of a beam monitoring unit of the exposure apparatus illustrated in FIG. 1.

Information about the beam passed through the pattern 22a of the mask 22 and recognized by the beam monitoring unit 40 can be visualized as an image 40i as illustrated in FIG. 3. When the beam monitoring unit 40 recognizes, at a preset reference position 40r, the beam having passed through the pattern 22a of the mask 22, if a change due to, for example, aging or heat, the beam is recognized at the preset reference position 40r represented by a dashed line.

If a change occurs in the exposure apparatus, as illustrated in FIG. 3, the beam is recognized as being at a monitored position 40d different from the preset reference position 40r. In this case, although the position of an alignment key of the substrate 12 is checked through image information obtained by the imaging device of the alignment key monitoring unit 41 and the main stage 10 adjusts the position of the substrate 12 in such a way that the alignment key is placed at a preset position, the intended location of the substrate 12 would not be accurately exposed.

However, in the exposure apparatus according to various embodiments, since the exposure is performed in consideration of a difference between the monitored position 40d and the preset reference position 40r of a beam obtained by the beam monitoring unit 40 before the substrate 12 is provided, the intended location of the substrate 12 will be accurately exposed. That is, the control unit 50 will check, before the substrate 12 is provided, the monitored position 40d of the beam incident on the beam monitoring unit 40 based on information about the beam obtained by the beam monitoring unit 40, and output (before and/or after the substrate 12 is provided) a substrate position adjustment signal to the main stage 10 in consideration of a difference between the monitored position 40d and the preset reference position 40r.

In this case, the substrate position adjustment signal output by the control unit 50 may include a first position adjustment signal indicating the alignment key of the substrate 12 to be disposed at a preset alignment position 41r (see FIG. 4) with respect to the beam irradiation unit 30, and a second position adjustment signal corresponding to an adjustment vector $V_{ad}$ having the preset reference position 40r as a start point and having the monitored position 40d as an end point. A detailed description thereof of such embodiments is now provided.

Initially, the control unit 50 checks, before the substrate 12 is provided, the monitored position 40d of the beam incident on the beam monitoring unit 40 based on information about the beam obtained by the beam monitoring unit 40, and obtains adjustment information corresponding to preset the adjustment vector $V_{ad}$ having the preset reference position 40r as a start point and having the monitored position 40d as an end point. The second position adjustment signal about the adjustment information may be transmitted to the main stage 10 at this time or later.

After that, if the substrate 12 is provided, the alignment key monitoring unit 41 allows the alignment key of the substrate 12 to be disposed at the preset alignment position 41r with respect to the beam irradiation unit 30. The above process may be performed if, as illustrated as an image 41i in FIG. 4, the control unit 50 transmits to the main stage 10 the first position adjustment signal corresponding to a base vector $V_b$ having a detected position 41d of the alignment key, which is checked by the alignment key monitoring unit 41, as a start point and having the preset alignment position 41r of the alignment key as an end point. After all, the above process can be understood as a process whereby the main stage 10 adjusts the position of the substrate 12 in such a way that the alignment key of the substrate 12 moves from the detected position 41d to the preset alignment position 41r.

Then, if the control unit 50 transmits the second position adjustment signal corresponding to the already-obtained adjustment vector $V_{ad}$ to the main stage 10, or by using the already-transmitted second position adjustment signal, the main stage 10 will additionally adjust the position of the substrate 12 so as to ultimately allow the beam to accurately reach an intended region on the substrate 12 without error.

Figure 4:
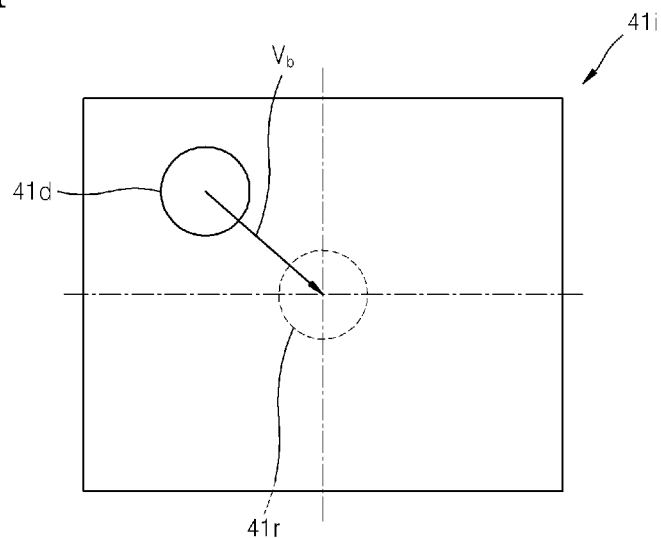
FIG. 4 is a conceptual view of an image of information obtained by recognizing an alignment key of a substrate in an alignment key monitoring unit of the exposure apparatus illustrated in FIG. 1.

Naturally, the disclosed technology is not limited thereto and may vary in configurations. For example, the control unit 50 checks, before the substrate 12 is provided, the monitored position 40d of the beam incident on the beam monitoring unit 40 based on the information about the beam obtained by the beam monitoring unit 40, and obtains adjustment information corresponding to the adjustment vector $V_{ad}$ having the preset reference position 40r as a start point and having the monitored position 40d as an end point. After that, if the substrate 12 is provided, as illustrated in FIG. 4, basic information corresponding to the base vector $V_b$ having the detected position 41d of the alignment key, which is checked by the alignment key monitoring unit 41, as a start point and having the preset alignment position 41r of the alignment key as an end point is checked. After that, the control unit 50 may transmit to the main stage 10 a position adjustment signal corresponding to a sum of the base vector $V_b$ and the adjustment vector $V_{ad}$ and thus the main stage 10 may adjust the position of the substrate 12.

Figure 5:
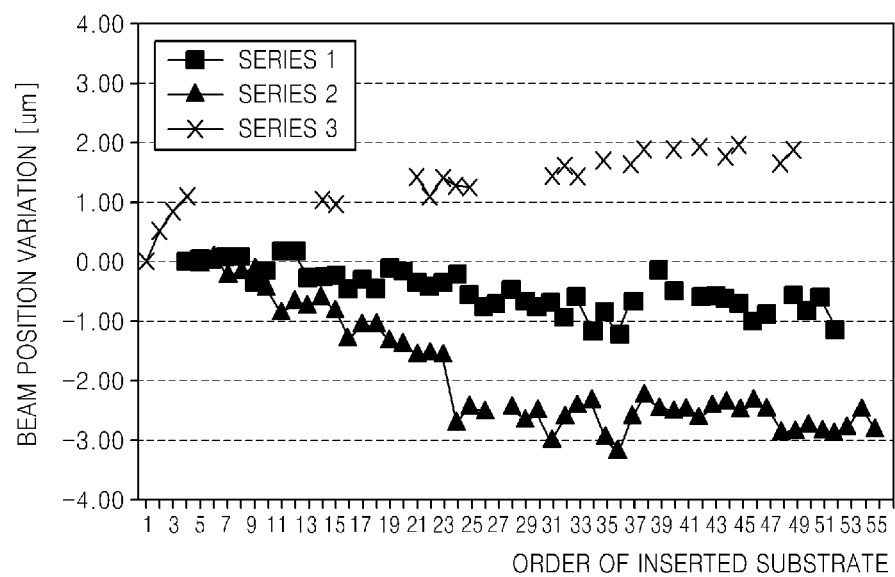
FIG. 5 is a graph showing a beam position variation when an exposure apparatus according to a comparative example is used.
Figure 6:
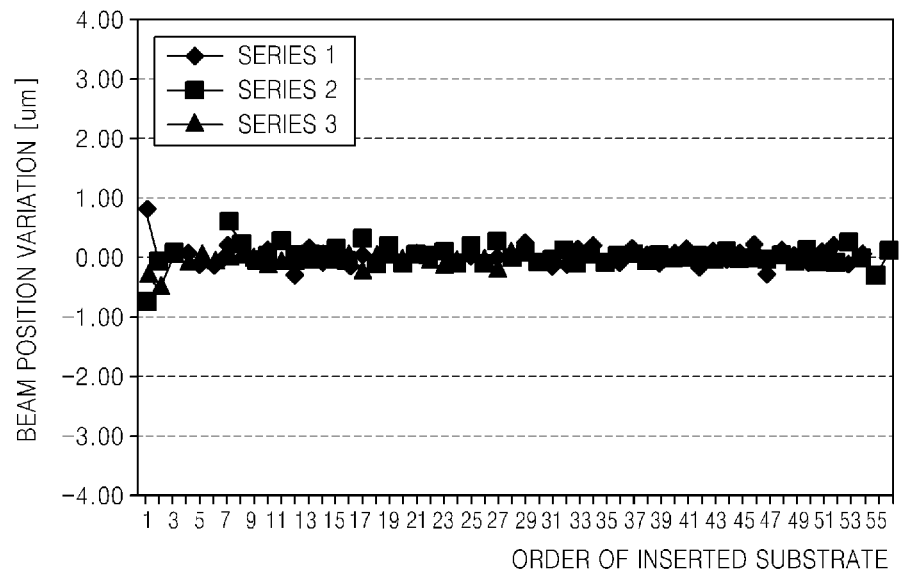
FIG. 6 is a graph showing a beam position variation when the exposure apparatus illustrated in FIG. 1 is used.

FIG. 5 is a graph showing a beam position variation when an exposure apparatus according to a comparative example is used. FIG. 6 is a graph showing a beam position variation when the exposure apparatus illustrated in FIG. 1 is used. In FIGS. 5 and 6, a horizontal axis represents an order of a provided substrate, and a vertical axis represents the beam position variation in units of μm. Three series of exposure are performed from a first series to a third series, and about fifty substrates are provided in each series.

As shown in FIGS. 5 and 6, when the exposure apparatus according to the comparative example is used, a variation in position of a beam emitted from the beam irradiation unit 30 is increased as time passes and the position sometimes varies by about 2 μm or more with respect to an initial position. This result means that the accuracy of exposure is greatly reduced. However, when the exposure apparatus according to the current embodiment is used, the beam position variation is less than 1 μm, and thus exposure may be performed at a high accuracy.

In the above description, while exposure is performed by fixing the position of the mask 22 and then sequentially providing substrates 12, the beam monitoring unit 40, before each substrate 12 is provided, obtains information for adjusting the position of the substrate 12, the substrate 12 is provided, and then the position of the substrate 12 is adjusted according to the already-obtained information. However, the disclosed technology is not limited thereto.

Figure 7:
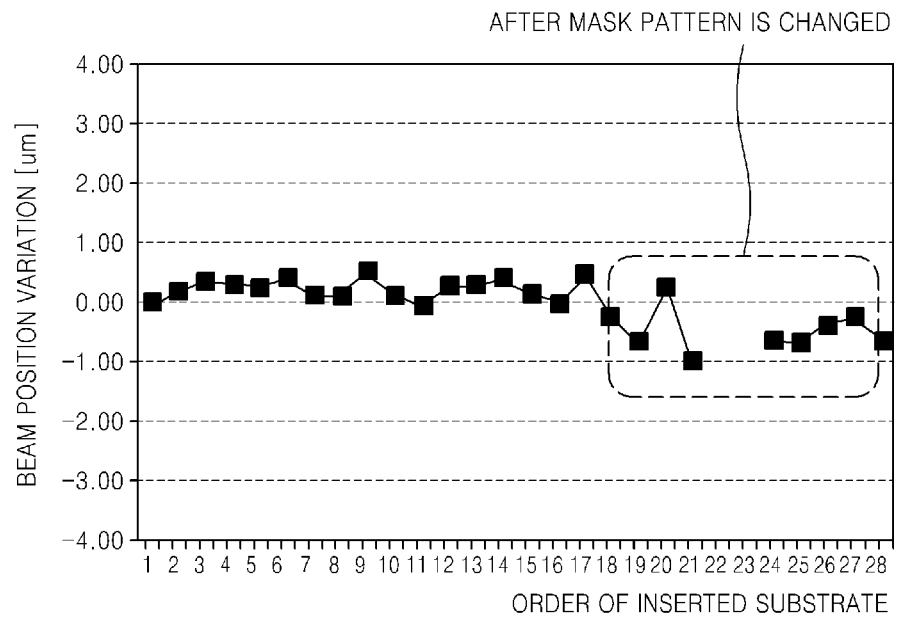
FIG. 7 is a graph showing a beam position variation when the exposure apparatus illustrated in FIG. 1 is used and a pattern of a mask is changed.

For example, the disclosed technology may also be applied when the mask 22 is replaced to change the pattern 22a of the mask 22 or when the position of the mask 22 is changed. FIG. 7 is a graph showing a beam position variation when the exposure apparatus illustrated in FIG. 1 is used and the pattern 22a of the mask 22 is changed. As shown in FIG. 7, even when the substrate 12 is provided after the pattern 22a of the mask 22 is changed, the beam position variation is less than 1 μm and is effectively suppressed.

In the above description, the main stage 10 adjusts the position of the substrate 12 by using information obtained by the beam monitoring unit 40. However, the disclosed technology is not limited thereto. That is, if the mask 22 is not simply disposed at a preset fixed location but is disposed, as illustrated in FIG. 1, on the mask stage 20 for adjusting the position of the mask 22, the control unit 50 may output a mask position adjustment signal in consideration of information about a beam obtained by the beam monitoring unit 40 and thus the mask stage 20 may adjust the position of the mask 22. In this case, if the substrate 12 is provided thereafter, the main stage 10 may receive from the control unit 50 a substrate position adjustment signal corresponding to the base vector $V_b$ having the detected position 41d of the alignment key of the substrate 12, which is checked by the alignment key monitoring unit 41, as a start point and having the preset alignment position 41r as an end point, and may adjust the position of the substrate 12, thereby allowing an intended location of the substrate 12 to be accurately exposed.

In this case, the control unit 50 may check the monitored position 40d of the beam incident on the beam monitoring unit 40 based on the information about the beam obtained by the beam monitoring unit 40, and may output the mask position adjustment signal in consideration of a difference between the monitored position 40d and the preset reference position 40r.

In the above description, the main stage 10 or the mask stage 20 adjusts the position of the substrate 12 or the mask 22 by using information obtained by the beam monitoring unit 40. However, the disclosed technology is not limited thereto. For example, to adjust a position of the alignment key monitoring unit 41 by using the information obtained by the beam monitoring unit 40 may be considered. That is, the control unit 50 may output an alignment key monitoring unit position adjustment signal for adjusting the position of the alignment key monitoring unit 41, in consideration of information about a beam obtained by the beam monitoring unit 40.

Furthermore, as illustrated in FIG. 3, the control unit 50 may check the monitored position 40d of the beam incident on the beam monitoring unit 40 based on the information about the beam obtained by the beam monitoring unit 40, and may output the alignment key monitoring unit position adjustment signal in consideration of a difference between the monitored position 40d and the preset reference position 40r. The alignment key monitoring unit position adjustment signal may correspond to the adjustment vector $V_{ad}$ having the preset reference position 40r as a start point and having the monitored position 40d as an end point. In this case, if the substrate 12 is provided thereafter, the main stage 10 may receive from the control unit 50 a substrate position adjustment signal corresponding to the base vector $V_b$ having the detected position 41d of the alignment key of the substrate 12, which is checked by the alignment key monitoring unit 41, as a start point and having the preset alignment position 41r as an end point, and may adjust the position of the substrate 12, thereby allowing an intended location of the substrate 12 to be accurately exposed.

Figure 8:
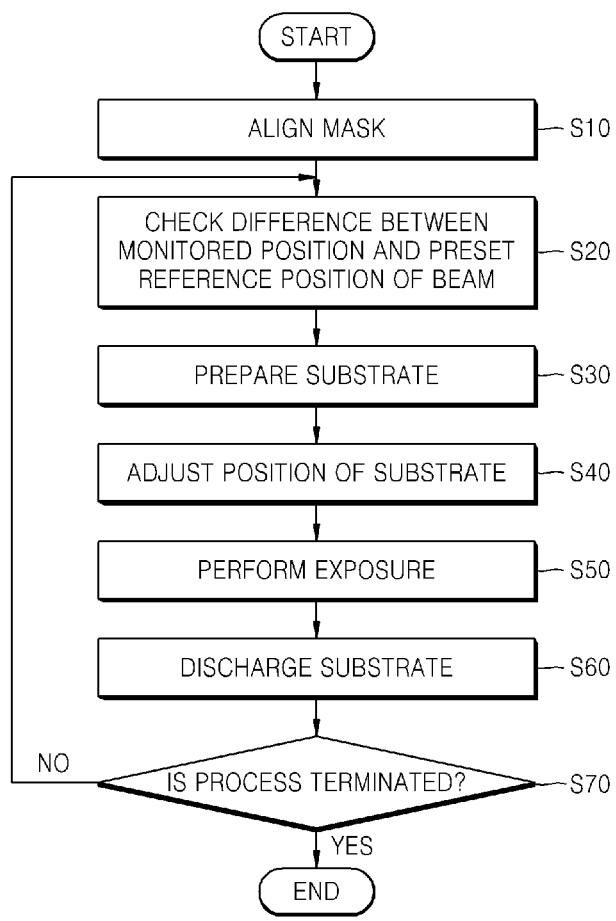
FIG. 8 is a flowchart of a method of controlling an exposure apparatus, according to an embodiment of the disclosed technology.

FIG. 8 is a flowchart of a method of controlling an exposure apparatus, according to an embodiment of the disclosed technology.

In the method according to the various embodiments, initially, a mask is aligned with respect to the exposure apparatus (for example, a beam irradiation unit) (S10). However, if an already-aligned mask exists in the exposure apparatus, operation S10 may not be performed. After that, a beam monitoring unit having a position fixed with respect to a main stage obtains information about a beam emitted from the beam irradiation unit and passed through one pattern of the mask, checks a monitored position of the beam incident on the beam monitoring unit based on the obtained information, and checks a difference between the monitored position and a preset reference position (S20). Here, the checked difference determines a degree of compensation to be performed later.

Then, a substrate is prepared (S30). Operation S30 may be, for example, an operation of mounting the substrate on the main stage or a substrate mounting unit having a position adjustable by the main stage. Then, a position of the substrate is adjusted by outputting a substrate position adjustment signal to the main stage in consideration of the difference between the monitored position and the preset reference position (S40). As such, the substrate may be aligned with respect to the beam irradiation unit and also the checked difference may be compensated.

After that, exposure is performed (S50), and the completely exposed substrate is discharged (S60). After the provided substrate is exposed, it is determined whether to terminate the process (S70). If it is determined not to terminate the process, before a next substrate is provided, the beam monitoring unit re-checks the difference between the monitored position and the preset reference position of the beam (S20) and then subsequent processes for exposure are sequentially performed.

In the above-described method according to various embodiments, the adjusting of the position of the substrate may include two steps of allowing an alignment key of the substrate to be disposed at a preset alignment position with respect to the beam irradiation unit, and additionally adjusting the position of the substrate by an adjustment vector having the preset reference position of the beam as a start point and having the monitored position of the beam, which is monitored by the beam monitoring unit, as an end point. Alternatively, the adjusting of the position of the substrate may include one step of adjusting the position of the substrate in consideration of an ultimate vector corresponding to a sum of a base vector having a detected position of the alignment key of the substrate, which is obtained by an alignment key monitoring unit for obtaining information about the position of the alignment key of the substrate, as a start point and having the preset alignment position of the alignment key with respect to the beam irradiation unit as an end point, and an adjustment vector having the preset reference position of the beam as a start point and having the monitored position of the beam, which is monitored by the beam monitoring unit, as an end point.

Figure 9:
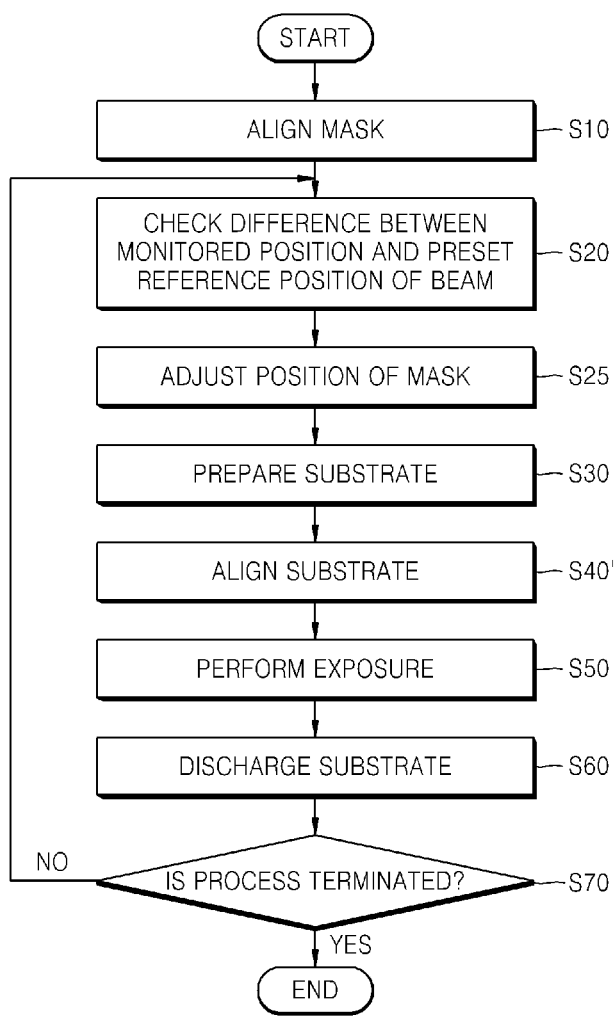
FIG. 9 is a flowchart of a method of controlling an exposure apparatus, according to another embodiment of the disclosed technology.

FIG. 9 is a flowchart of a method of controlling an exposure apparatus, according to another embodiment of the disclosed technology.

In the method according to the current embodiment, initially, a mask is aligned with respect to the exposure apparatus (for example, a beam irradiation unit) (S10). However, if an already-aligned mask exists in the exposure apparatus, operation S10 may not be performed. After that, a beam monitoring unit having a position fixed with respect to a main stage obtains information about a beam emitted from the beam irradiation unit and passed through one pattern of the mask, checks a monitored position of the beam incident on the beam monitoring unit based on the obtained information, and checks a difference between the monitored position and a preset reference position (S20). Here, the checked difference determines a degree of compensation to be performed later.

After that, before a substrate is provided, a position of the mask is adjusted by outputting a mask position adjustment signal to a mask stage in consideration of the difference between the monitored position and the preset reference position of the beam (S25). As such, since the checked difference is compensated, a reduction in the accuracy of exposure of the exposure apparatus due to, for example, the influence of aging or the influence of heat may be prevented.

Then, the substrate is prepared (S30). Operation S30 may be, for example, an operation of mounting the substrate on the main stage or a substrate mounting unit having a position adjustable by the main stage. After that, an alignment key monitoring unit checks a detected position of an alignment key of the substrate and, in order to allow the alignment key to be disposed at a preset alignment position, a position of the substrate is adjusted by outputting a substrate position adjustment signal to the main stage (S40').

After that, exposure is performed (S50), and the completely exposed substrate is removed (S60). After the provided substrate is exposed, it is determined whether to terminate the process (S70). If it is determined not to terminate the process, before a next substrate is provided, the beam monitoring unit re-checks the difference between the monitored position and the preset reference position of the beam (S20) and then subsequent processes for exposure are sequentially performed.

Figure 10:
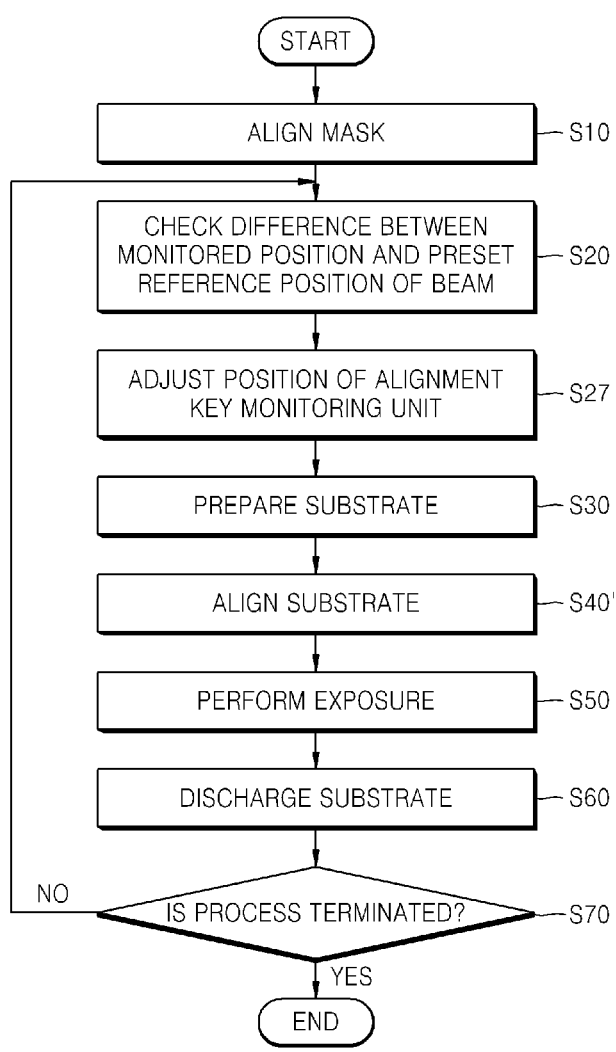
FIG. 10 is a flowchart of a method of controlling an exposure apparatus, according to another embodiment of the disclosed technology.

FIG. 10 is a flowchart of a method of controlling an exposure apparatus, according to another embodiment of the disclosed technology.

In the method according to various embodiments, initially, a mask is aligned with respect to the exposure apparatus (for example, a beam irradiation unit) (S10). However, if an already-aligned mask exists in the exposure apparatus, operation S10 may not be performed. After that, a beam monitoring unit having a position fixed with respect to a main stage obtains information about a beam emitted from the beam irradiation unit and passed through one pattern of the mask, checks a monitored position of the beam incident on the beam monitoring unit based on the obtained information, and checks a difference between the monitored position and a preset reference position (S20). Here, the checked difference determines a degree of compensation to be performed later.

After that, before a substrate is provided, a position of an alignment key monitoring unit for obtaining information about a position of an alignment key of the substrate is adjusted in consideration of the difference between the monitored position of the beam, which is monitored by the beam monitoring unit, and the preset reference position of the beam (S27). As such, since the checked difference is compensated, a reduction in the accuracy of exposure of the exposure apparatus due to, for example, the influence of aging or the influence of heat may be prevented. Here, the adjusting of the position of the alignment key monitoring unit may correspond to an adjustment vector having the preset reference position of the beam as a start point and having the monitored position of the beam, which is monitored by the beam monitoring unit, as an end point.

Then, the substrate is prepared (S30). Operation S30 may be, for example, an operation of mounting the substrate on the main stage or a substrate mounting unit having a position adjustable by the main stage. After that, an alignment key monitoring unit checks a detected position of an alignment key of the substrate and, in order to allow the alignment key to be disposed at a preset alignment position, a position of the substrate is adjusted by outputting a substrate position adjustment signal to the main stage (S40').

After that, exposure is performed (S50), and the completely exposed substrate is discharged (S60). After the provided substrate is exposed, it is determined whether to terminate the process (S70). If it is determined not to terminate the process, before a next substrate is provided, the beam monitoring unit re-checks the difference between the monitored position and the preset reference position of the beam (S20) and then subsequent processes for exposure are sequentially performed.

Although a method of controlling an exposure apparatus is described above, the disclosed technology is not limited thereto. For example, the disclosed technology may also cover an alignment method for exposure.

In an alignment method for exposure, according to an embodiment of the disclosed technology, initially, a monitored position of a beam emitted from a beam irradiation unit and passed through one pattern of a mask is checked and a difference between the monitored position and a preset reference position is checked. After that, a substrate is prepared and a position of the substrate is adjusted in consideration of the difference between the monitored position and the preset reference position of the beam. As such, since the checked difference is compensated, a reduction in the accuracy of exposure of an exposure apparatus due to, for example, the influence of aging or the influence of heat may be prevented.

Here, the adjusting of the position of the substrate may include two steps of allowing an alignment key of the substrate to be disposed at a preset alignment position with respect to the beam irradiation unit, and additionally adjusting the position of the substrate by an adjustment vector having the preset reference position of the beam as a start point and having the monitored position of the beam, which is monitored by the beam monitoring unit, as an end point. Alternatively, the adjusting of the position of the substrate may include one step of adjusting the position of the substrate in consideration of an ultimate vector corresponding to a sum of a base vector having a detected position of the alignment key of the substrate as a start point and having the preset alignment position of the alignment key with respect to the beam irradiation unit as an end point, and an adjustment vector having the preset reference position of the beam as a start point and having the monitored position of the beam as an end point.

In the alignment method according to the current embodiment, a position of the mask may also be adjusted by checking the monitored position of the beam emitted from the beam irradiation unit and passed through the pattern of the mask, and checking and considering the difference between the monitored position and the preset reference position of the beam.

In this case, if the substrate is provided thereafter, even when the substrate is typically aligned with respect to the beam irradiation unit, an intended location of the substrate may be accurately exposed.

In the above description, an error is compensated by moving a substrate or a mask. However, the disclosed technology is not limited thereto. For example, it may be considered to adjust a position of an alignment key monitoring unit for obtaining information about a position of an alignment key of the substrate by checking a monitored position of a beam emitted from a beam irradiation unit and passed through one pattern of the mask, and checking and considering a difference between the monitored position and a preset reference position of the beam. Here, the adjusting of the position of the alignment key monitoring unit may correspond to an adjustment vector having the preset reference position of the beam as a start point and having the monitored position of the beam as an end point.

In this case, if the substrate is provided thereafter, even when the substrate is typically aligned with respect to the beam irradiation unit, an intended location of the substrate may be accurately exposed.

The above-described exposure apparatus, the method of controlling the same, and the alignment method for exposure may use a laser-induced thermal imaging (LITI) process. That is, a laser beam may be irradiated from the beam irradiation unit 30, a donor film may be disposed between the mask 22 and the substrate 12, and the laser beam may be irradiated onto a certain region of the donor film such that a certain organic layer of the donor film may be transferred onto the substrate 12. Since an organic light-emitting display apparatus on which an organic or inorganic layer including an emission layer is formed by using the above LITI process functions appropriately only when the organic or inorganic layer is formed at an accurate position, if the above-described exposure apparatus, the method of controlling the same, and the alignment method for exposure are used, a high-resolution organic light-emitting display apparatus may be manufactured at a high yield rate.

As described above, according to an embodiment of the disclosed technology, an exposure apparatus capable of preventing a reduction in the accuracy of exposure of the exposure apparatus due to, for example, the influence of aging or the influence of heat, a method of controlling the same, and an alignment method for exposure may be achieved. However, the disclosed technology is not limited to the above-mentioned effect.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An exposure apparatus, comprising:
a main stage configured to adjust the position of a substrate, the substrate having an alignment key;
a mask stage configured to adjust the position of a mask, the mask having an alignment mark;
an alignment configured to check the position of the alignment key;
an alignment mark monitoring unit configured to check the position of the alignment mark;
a beam irradiation unit configured to irradiate a beam of light onto a mask;
a beam monitoring unit having a position fixed with respect to the main stage, and configured to recognize the beam emitted from the beam irradiation unit and passed through openings in the mask so as to form a particular pattern, the beam monitoring unit being separated from the alignment mark monitoring unit; and
a control unit configured to output a substrate position adjustment signal indicative of the position of the main stage so as to adjust the position of the substrate to account for changes in alignment of an optical unit in the beam irradiation unit or transformation of a frame due to heat generated during exposure, even though the substrate is accurately positioned with respect to the alignment key monitoring unit and the mask is accurately positioned with respect to the alignment mark monitoring unit.

2. The exposure apparatus of claim 1, wherein the control unit outputs the substrate position adjustment signal based on information about the beam obtained by the beam monitoring unit.

3. The exposure apparatus of claim 2, wherein the control unit is configured to check a monitored position of the beam incident on the beam monitoring unit, wherein the monitored position is based on the information about the beam obtained by the beam monitoring unit, and wherein the control unit outputs the substrate position adjustment signal based on the difference between the monitored position and a preset reference position.

4. The exposure apparatus of claim 3, wherein the substrate position adjustment signal output from the control unit comprises:
 a first position adjustment signal used to permit the alignment key of the substrate to be disposed at a preset alignment position with respect to the alignment key monitoring unit; and
 a second position adjustment signal corresponding to an adjustment vector having the preset reference position as a start point and having the monitored position as an end point.

5. The exposure apparatus of claim 3, wherein the substrate position adjustment signal output from the control unit corresponds to a sum of a base vector having a detected position of the alignment key of the substrate, which is obtained by the alignment key monitoring unit, as a start point and having the preset alignment position with respect to the beam irradiation unit as an end point, and an adjustment vector having the preset reference position as a start point and having the monitored position as an end point.

6. The exposure apparatus of claim 1, further comprising a mask stage for adjusting the position of the mask, wherein the control unit outputs a mask position adjustment signal indicative of the position of the mask stage so as to adjust the position of the mask based on information about the beam obtained by the beam monitoring unit.

7. The exposure apparatus of claim 6, wherein the control unit is configured to check a monitored position of the beam incident on the beam monitoring unit based on the information about the beam obtained by the beam monitoring unit, and wherein the control unit outputs the mask position adjustment signal based on a difference between the monitored position and a preset reference position.

8. The exposure apparatus of claim 1, wherein the control unit outputs an alignment key monitoring unit position adjustment signal configured to adjust the position of the alignment key monitoring unit.

9. The exposure apparatus of claim 8, wherein the control unit outputs the alignment key monitoring unit position adjustment signal based on information about the beam obtained by the beam monitoring unit.

10. The exposure apparatus of claim 9, wherein the control unit is configured to check a monitored position of the beam incident on the beam monitoring unit based on the information about the beam obtained by the beam monitoring unit, and wherein the control unit outputs the alignment key monitoring unit position adjustment signal based on the difference between the monitored position and a preset reference position.

11. The exposure apparatus of claim 10, wherein the alignment key monitoring unit position adjustment signal output from the control unit corresponds to an adjustment vector having the preset reference position as a start point and having the monitored position as an end point.

12. A method of controlling an exposure apparatus, the method comprising:
 mounting a substrate on either of a main stage or a substrate mounting unit having a position that is adjustable by the main stage;
 obtaining information about the position of an alignment key on the substrate by an alignment key monitoring unit;
 adjusting the position of the substrate such that the alignment key is placed at a preset position;
 obtaining information about the position of an alignment mark on a mask by an alignment mark monitoring unit;
 adjusting the position of the mask such that the alignment mark is placed at a preset position;
 obtaining information about a beam of light emitted from a beam irradiation unit and passed through openings in a mask so as to form a particular pattern, by a beam monitoring unit having a position fixed with respect to the main stage, the beam monitoring unit being separated from the alignment mark monitoring unit;
 checking a monitored position of the beam incident on the beam monitoring unit based on the information about the beam obtained by the beam monitoring unit, and checking the difference between the monitored position and a preset reference position; and
 additionally adjusting the position of the substrate by outputting a substrate position adjustment signal to the main stage based on the difference between the monitored position and the preset reference position to account for changes in alignment of an optical unit in the beam irradiation unit or transformation of a frame due to heat generated during exposure, even though the substrate is accurately positioned with respect to the alignment key monitoring unit and the mask is accurately positioned with respect to the alignment mark monitoring unit.

13. The method of claim 12, wherein the additionally adjusting of the position of the substrate comprises:
 additionally adjusting the position of the substrate by an adjustment vector having the preset reference position as a start point and having the monitored position as an end point.

14. The method of claim 12, wherein the additionally adjusting of the position of the substrate comprises additionally adjusting the position of the substrate based on an ultimate vector corresponding to the sum of a base vector having a detected position of the alignment key of the substrate as a start point and having the preset alignment position with respect to the beam irradiation unit as an end point, and an adjustment vector having the preset reference position as a start point and having the monitored position as an end point.

15. A method of controlling an exposure apparatus, the method comprising:
 mounting a mask on a mask stage;
 obtaining information about the position of an alignment key on a substrate by an alignment key monitoring unit;
 adjusting the position of the substrate such that the alignment key is placed at a preset position;
 obtaining information about the position of an alignment mark on the mask by an alignment mark monitoring unit;
 adjusting the position of the mask such that the alignment mark is placed at a preset position;

obtaining information about a beam of light emitted from a beam irradiation unit and passed through openings in a mask so as to form a particular pattern and having a position adjustable by a mask stage, in a beam monitoring unit having a position fixed with respect to a main stage, the beam monitoring unit being separated from the alignment mark monitoring unit;

checking a monitored position of the beam incident on the beam monitoring unit based on the information about the beam obtained by the beam monitoring unit, and checking the difference between the monitored position and a preset reference position; and additionally adjusting the position of the mask by outputting a mask position adjustment signal to the mask stage based on the difference between the monitored position and the preset reference position.

* * * * *